United States Patent [19]
Meddaugh

[11] 3,820,035
[45] June 25, 1974

[54] MICROWAVE AUTOMATIC FREQUENCY CONTROL CIRCUIT

[75] Inventor: Gard E. Meddaugh, Mountain View, Calif.

[73] Assignee: Varian Associates, Palo Alto, Calif.

[22] Filed: Feb. 26, 1973

[21] Appl. No.: 336,157

[52] U.S. Cl. ............ 328/233, 315/5.41, 315/39.51, 331/5, 333/24 R
[51] Int. Cl. ...................... H01j 23/00, H01j 23/34
[58] Field of Search ...... 331/5, 6, 34; 333/24, 31 A; 315/3.5 X, 5.41, 39.51; 328/233

[56] References Cited

UNITED STATES PATENTS

| | | | |
|---|---|---|---|
| 2,564,005 | 8/1951 | Halpern et al. | 331/5 |
| 2,748,384 | 5/1956 | Crane, Jr. et al. | 331/6 X |
| 3,139,592 | 6/1964 | Sisson | 331/5 |
| 3,154,739 | 10/1964 | Thomas et al. | 331/6 X |
| 3,178,652 | 4/1965 | Scharfman et al. | 331/5 |

*Primary Examiner*—James W. Lawrence
*Assistant Examiner*—Saxfield Chatmon, Jr.
*Attorney, Agent, or Firm*—Stanley Z. Cole; John J. Morrissey

[57] ABSTRACT

The frequency of a microwave source, such as a magnetron of klystron, is locked to the variable frequency of a resonant load. A sample of the microwave power incident on the load is derived from the magnetron and compared in a phase comparator with a sample of the microwave energy reflected from the resonant load to derive an error signal representative of the frequency departure of the frequency of the microwave source from the resonant frequency of the load. The error signal is utilized for driving a tuner for tuning the frequency of the microwave source to the frequency of the load. In a preferred embodiment the phase comparator comprises a three db four port microwave hybrid coupler having a pair of outputs, the outputs of which are rectified by microwave diodes and subtracted to produce the error signal. The length of the transmission path from the microwave source to the phase comparator circuit is made longer than the length of the transmission path from the microwave source to the load and back to the phase comparator circuit in order to skew the frequency discriminator output characteristic of the phase comparator in order to eliminate ambiguities in the sense of the error signal at frequencies far removed from the resonant frequency of the load.

9 Claims, 4 Drawing Figures

MICROWAVE AUTOMATIC FREQUENCY CONTROL CIRCUIT

BACKGROUND OF THE INVENTION

The present invention relates in general to automatic frequency control circuits and more particularly to an improved automatic frequency control circuit which locks the frequency of a microwave source to the variable frequency of a resonant load coupled thereto.

DESCRIPTION OF THE PRIOR ART

Heretofore, microwave circuits have been proposed for locking the frequency of a microwave source to the variable frequency of a resonant load excited by the microwave source. One such prior art circuit is disclosed and claimed in U.S. Pat. No. 3,714,592 issued Jan. 30 1973 and assigned to the same assignee as the present invention.

In this prior automatic frequency control circuit, microwave power from a magnetron oscillator was applied to a resonant section of coupled cavity resonators, forming a standing wave resonator, via a circulator for accelerating a beam of charged particles passing through the resonator to an energy of several Mev. Power reflected from the resonator passed back to the circulator and thence to a load coupled to a third port of the circulator. A reflector and variable phase shifter was coupled to the third port of the circulator between the circulator and the load for reflecting a certain portion of the reflected power back to the magnetron to cause the magnetron to pull onto the resonant frequency of the load.

This prior circuit works well when the frequency of the magnetron is within the half power bandwidth of the resonant load. However, due to the relatively high Q of the resonant load, i.e., a Q of approximately 4,000, the magnetron may have an initial frequency setting outside the bandwidth of the resonant load. Therefore a manual tuning of the magnetron is required in order to bring the frequency of the magnetron within the lock-on capture bandwidth of the load.

In another prior art microwave automatic frequency control circuit, the aforecited circuit was utilized with a pair of frequency discriminating reference cavity resonators tuned to slightly different frequencies straddling the frequency of the resonant load. Samples of the incident power from the magnetron were used to excite the dual AFC cavities. The excitation of the cavities was sampled and rectified to produce a d.c. frequency discriminator error signal having a sense and magnitude which was a function of the departure of the frequency of the incident power from the center frequency of the dual cavity frequency discriminator.

The frequency discriminator error signal output of the dual cavity discriminator circuit was fed to a servo amplifier and motor for automatically tuning the frequency of the magnetron to the reference frequency determined by the dual cavity frequency discriminator.

While this latter prior art circuit is suitable for bringing the frequency of the magnetron within the capture bandwidth of the first mentioned prior art automatic frequency control circuit, it involves a substantial amount of complexity and requires relatively accurate thermal control, i.e., uniform coolant temperature control of the discriminator and load to within one half of a degree C. However, control of the fluid coolant is inadequate to provide frequency tracking as the microwave power to the load produces a disproportionate temperature increase of the load relative to the dual cavity discriminator.

It would be desirable to provide an improved automatic frequency control circuit which would track relatively wide variations in frequency of the load and which would automatically tune the microwave source to a frequency within the capture bandwidth of the resonant load.

SUMMARY OF THE PRESENT INVENTION

The principal object of the present invention is the provision of an improved microwave automatic frequency control circuit for automatically tuning the frequency of a microwave source to the variable frequency of a resonant load coupled to the microwave source.

In one feature of the present invention, a microwave phase comparator circuit is provided for comparing the phase of a sample of the incident power supplied by the microwave source with the phase of a sample of the wave energy reflected from the resonant load to derive a d.c. error signal the sense of which is determinative of the sense of departure if any of the microwave frequency of the source from the microwave resonant frequency of the load.

In another feature of the present invention, a three db hybrid coupler is provided for comparing the phase of the incident power with the phase of the power reflected from the load to derive a pair of microwave outputs. The outputs are rectified and compared with each other to derive a difference d.c. frequency discriminator error signal which has a sense determinative of the sense of departure, if any, of the microwave frequency of the source from the microwave resonant frequency of the load.

In another feature of the present invention, a microwave phase comparator circuit is provided for comparing the phase of the incident power derived from the microwave source with the power reflected from the resonant load to derive an error signal for controlling the frequency of the microwave source. The transmission path length for microwave energy derived from the source and fed to one input of the microwave comparator is greater than the transmission path length for microwave energy derived from the microwave source and fed to the resonant load and thence reflected to the phase comparator, whereby the frequency discriminating output characteristic for the phase comparator is skewed to provide an unambiguous error signal output over a relatively wide tunable band of the microwave source.

Other features and advantages of the present invention will become apparent upon a perusal of the following specification taken in connection with the accompanying drawings wherein:

DESCRIPTION OF THE PREFERRED EMBODIMENT

Figure 1:
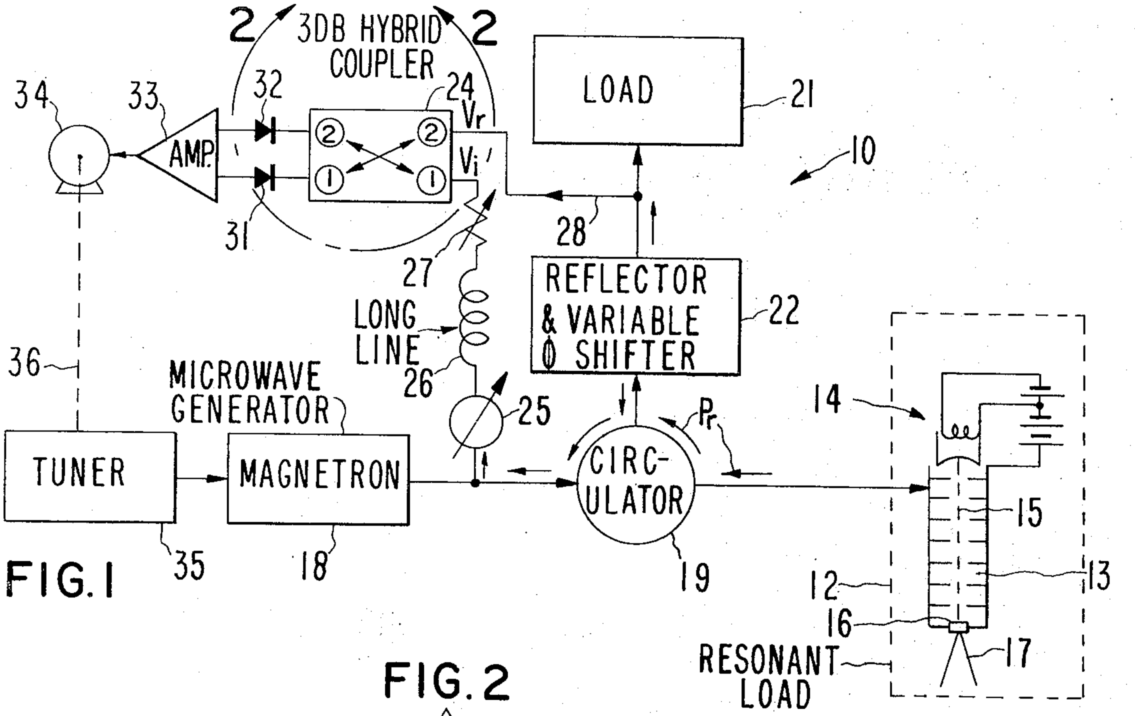
FIG. 1 is a schematic circuit diagram, partly in block diagram form, of a microwave circuit incorporating features of the present invention.

Referring now to FIG. 1, there is shown a microwave circuit 10 employing features of the present invention. The circuit 10 of FIG. 1 is substantially similar to that described in the aforecited U.S. Pat. No. 3,714,592, hereby incorporated by reference, with the exception that the circuit is modified to include a phase comparator type frequency discriminator to derive an error signal for controlling a motorized tuner as more fully disclosed below.

Briefly, the microwave circuit 10 includes a resonant load 12, such as a linear accelerator, having a plurality of cavity resonators successively coupled together to form the microwave accelerator section 13. The accelerator section 13 accelerates a beam of electrons, as supplied from an electron gun 14, to a relatively high energy level, as of several Mev. The beam is accelerated through the centrally apertured coupled resonators and impinges upon an X-ray target 16 producing a high energy X-ray beam 17 which is projected from the target 16 onto an object or person to be irradiated or treated.

In a typical example, accelerator section 13 has a Q of approximately 4,000 and operates at S-band. It is driven with pulses of microwave power supplied to the microwave accelerator 13 from a microwave generator or source 18, such as a tunable magnetron or klystron and driver, via the intermediary of a suitable isolator 19, such as a three port circulator. The magnetron 18 supplies pulses of 2 megawatt peak power and 2 kilowatt average power to the resonant load 12. A suitable magnetron 18 is a Thompson-Varian Model TV-1542 which is tunable from 2992 to 3001 $MH_z$. As an alternative, the microwave source 18 may comprise a klystron amplifier driven with microwave energy derived from a relatively low power source, such as a varactor tuned solid state microwave source.

A wave absorptive load 21 is coupled to the third port of the circulator 19 via the intermediary of a composite variable phase wave reflector 22. The load 21 absorbs power reflected from the resonant load 12 which has traveled back to the circulator and thence via output port 3 and variable reflector and phase shifter 22 to the load 21. More particularly, an impedance mismatch, as encountered at the beginning and end of each pulse of microwave energy supplied to the resonant load 12, is reflected from the load 12 back to the circulator 19 and thence to the wave absorptive load 21.

The variable phase wave reflector 22 is provided for reflecting a certain small fraction of the reflected power back to the magnetron 18. This small fraction of the reflected power is larger than any wave reflection obtained from slight mismatches in the circulator 19, or other elements in the microwave circuit. This intentionally introduced reflection exerts a frequency pulling effect on the operating frequency of the magnetron 18 such that the resonant frequency of the magnetron is pulled toward the resonant frequency of the load. This desired pulling effect is obtained provided that the frequency of the magnetron is within the capture bandwidth of the resonant load 12. With a proper setting of the phase of the intentionally introduced wave reflection produced by the variable phase reflector 22, the magnetron 18 is intentionally pulled toward the resonant frequency of the load 12 for maximum power transfer to the resonant load 12.

As thusfar described, the circuit 10 is the same as that of the prior art disclosed in the aforecited U.S. Pat. No. 3,714,592. However, in this prior art circuit, it is found that the magnetron 18 will not be pulled to the resonant frequency of the load 12 unless the frequency of the magnetron is within the capture bandwidth of the resonant load, such capture bandwidth being relatively narrow compared to the tunable frequency range of the magnetron. Accordingly, in the present invention, a frequency discriminator and servo control for the tuner of the magnetron is provided for automatically tuning the frequency of the magnetron to within the capture bandwidth of the resonant load 12.

More particularly, a four port three db hybrid coupler 24 is connected into the circuit 10 via suitable coaxial lines such that a first input port of the hybrid coupler 24 is coupled to the output of the microwave generator 18 to sample a portion of the incident power supplied to the resonant load 12. The sampled incident power is derived from the waveguide communicating between magnetron 18 and the circulator 19 and is fed via an adjustable phase shifter 25 and a long length section of temperature independent coaxial line 26, more fully disclosed below, and thence through a variable attenuator 27 to the first input port 1 of the hybrid coupler 24. A sample of the reflected power is tapped from the waveguide communicating between the reflector and variable phase shifter 22 and the load 21 and fed via coaxial line 28 to the second input port 2 of the hybrid coupler 24.

In the hybrid coupler 24, the incident power signal $V_i$ is split and supplied to first and second output terminals 1 and 2, respectively, of the coupler 24. The phase of the incident voltage appearing at the second output terminal lags the incident microwave voltage at the first output terminal by 90° and both output $V_i$ signals are of equal amplitude. Likewise, the reflected power signal $V_r$ applied to the second input terminal is split equally and supplied to output terminals 1 and 2 of the coupler 24 with the microwave voltage of the reflected signal at output terminal 1 lagging the reflected voltage output signal at terminal 2 by 90°. The resultant microwave output signals at output terminals 1 and 2 of the hybrid coupler 24 are rectified by respective microwave diodes 31 and 32 to produce d.c. output voltages which are subtracted from each other and amplified in a differential amplifier 33 to derive a d.c. output error signal at the output of differential amplifier 33 which has a sense, i.e. either plus or minus, voltage, dependent upon the sense of departure, if any, of the microwave frequency of the microwave source 18 from the microwave resonant frequency of the resonant load 12. The frequency discriminating action of the phase comparator circuit is described in greater detail with regard to FIG. 2.

The frequency discriminating d.c. error signal at the output of amplifier 33 is fed to energize a d.c. motor 34 which in turn drives a tuner 35 of the magnetron 18 via a mechanical linkage 36. The tuner 35 tunes the resonant frequency of the microwave generator or source 18 in accordance with the sense of the output error signal at the output of amplifier 33. When the frequency of the microwave generator 18 is within the capture bandwidth of the resonant load 12, the magnetron is pulled via the variable phase wave reflector 22 toward the resonant frequency of the load. The frequency discriminator circuit can now stably tune the frequency of the magnetron 18 to the resonant frequency of the load.

Figure 2:
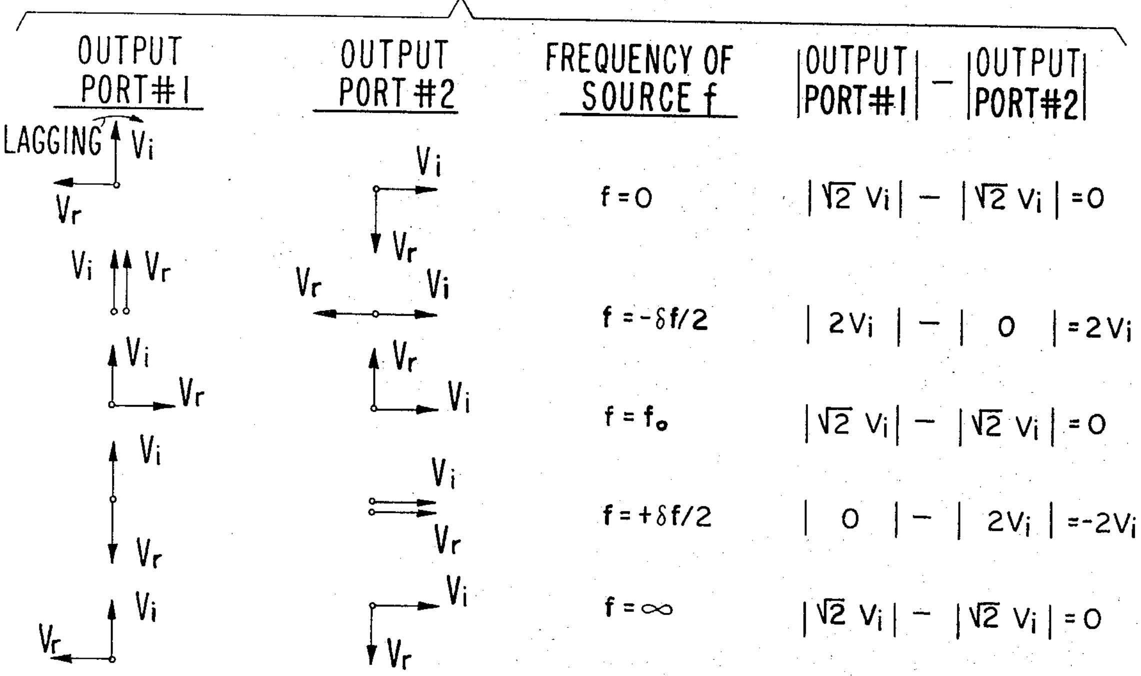
FIG. 2 is a composite plot of, phase diagrams, frequencies, and output voltages depicting the frequency discriminating action of the phase comparator circuit portion of FIG. 1 as delineated by line 2—2.

Referring now to FIG. 2, there is shown the simplified operation of the phase comparator frequency discriminator portion of the circuit of FIG. 1 delineated by line 2—2. More particularly, an initial condition is assumed for the phase diagrams of the first and second columns, such initial condition being that the lengths of transmission paths and phase shifts through the various circuit elements between the source 18 and the two input ports to the hybrid coupler 24 are such that when the frequency of the source f is tuned precisely to the resonant frequency $f_o$ of the resonant load 12, as indicated in the third row of the diagram, both $V_i$ and $V_r$ are in phase at the two input terminals 1 and 2 of the coupler 24.

It is further assumed that the load structure 13 is significantly overcoupled to the feed waveguide and that attenuator 25 is adjusted so that $|V_r|=|V_i|$. Although these are not necessary for operation, the action is more clearly explained with these assumptions. Actually, the frequency discriminator output will differ only in magnitude and not in sense for $|V_i| \neq |V_r|$ and for any degree of coupling of the source 18 to the load 12.

Thus, at the low frequency end of the tunable range of the source, as shown for $f=0$ in the first row of the composite diagram of FIG. 2, the reflected voltage component $V_r$ would normally lag $V_i$ at output port 1 by 90°, thus positioning the $V_r$ vector at the 90° position. However, the resonant load 12 appears substantially off frequency to the incident wave and therefore the reflected wave is additionally phase shifted by the load 180° due to the off resonance character of the load. This produces the phase relation of column one row one for output port 1. The resultant voltage V at output port 1 is the vector addition of $V_i$ and $V_r$ and is equal to $\sqrt{2}\,V_i$ or $\sqrt{2}\,V_r$. Likewise at the second output port $V_i$ has the same reference relation as shown in the third row for $f=f_o$ and $V_r$ is shifted by 180° relative to $V_r$ at $f=f_o$ due to the substantial off resonance condition of the load 12 to produce the phase relation shown in the second column of the first row for the second output port 2. The resultant output voltage at output port 2 is the vector sum of the two vectors $V_i$ and $V_r$. The resultant vector is equal in magnitude to the resultant vector at output port 1 such that when the magnitudes of the resultant voltages at output ports 1 and 2 are subtracted by the differential amplifier the output voltage is zero.

The second row of FIG. 2 shows the vector relations of the incident and reflected wave $V_i$ and $V_r$ at output ports 1 and 2 for a frequency of excitation f corresponding to the low frequency half power point of the resonance response of the load 12, where $\delta f$ corresponds to the total half power bandwidth of the resonant load 12. In such a case, the vector relations for the incident and reflected waves at output port 1 of the hybrid 24 are shown in column one, row two. More particularly, the incident voltage $V_i$ remains the same as the input port and the reflected voltage normally would have the relation shown in column 1, row 3. However, due to the 90° lead phase shift of the off resonance condition of the load 12, the reflected voltage vector $V_r$ is caused to be coincident and of equal magnitude with the incident voltage vector $V_i$. The sum of the incident and reflected voltage vectors $V_i$ and $V_r$ at output port 1 is 2 $V_i$ or 2 $V_r$. Likewise, the voltage relations at output port 2 are the same as at output port 2 for row 3 except that the voltage of the reflected wave is advanced by 90° due to the off resonance condition of the load to produce the voltage phase relation shown in the second column, second row, where the sum of the two vectors $V_i$ and $V_r$ is zero. Thus, the output of the differential amplifier 33 is given by the expression in the fourth column, second row yielding a +2V output voltage for driving the servo motor of the tuner.

Similarly, the other phase relations are shown in third, fourth and fifth rows of the chart of FIG. 2. More particularly, the frequency discriminator output voltage for the condition $f=f_o$ is zero output voltage. When the drive frequency f is on the high side of the resonant frequency of the load by half the half power bandwidth, a −2V error signal is obtained at the output of differential amplifier 33. When the frequency of the source f is substantially above the resonant frequency $f_o$ of the load, the frequency discriminator output voltage is again zero. Thus FIG. 2 has described the operation of the three db hybrid coupler 24 and frequency discriminator employing the diodes 32 and differential amplifier 33.

Figure 3:
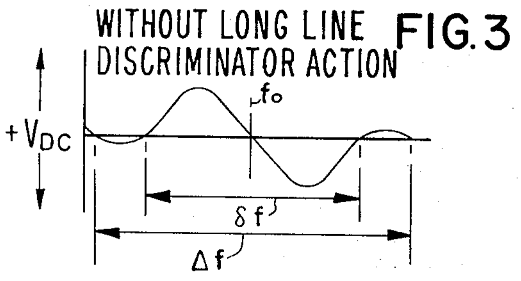
FIG. 3 is a plot of d.c. voltage output vs. frequency for the circuit of FIG. 1 without the provision of the long line discriminator action.

However, the precise output voltage relations shown in FIG. 2 apply only for the condition where the transmission path lengths for the incident wave $V_i$ and the reflected wave $V_r$ are equal between the two input ports to the hybrid coupler 24 and the source 18. Normally, this will not be the case since the incident wave need travel only from the source 18 to the hybrid coupler 24, whereas the reflected wave must travel from the source 18 via the circulator 19 to the load 12 and back from the load 12 through the circulator 19 and the phase shifter 22 to the hybrid coupler 24. Thus, in a typical installation, the transmission path length for the reflected wave $V_r$ would normally be expected to be longer than the path length for the incident wave $V_i$. When this is the case, the differential path length L introduces a frequency dependent phase shift in the relative phases between the incident signal $V_i$ and the reflected signal $V_r$. This, for the case where the reflected path length is longer than the incident path length, tends to skew the frequency discriminator output characteristic for the hybrid coupler discriminator 24, 31–33 to produce a resultant characteristic as shown in FIG. 3. More particularly, it is seen that zero crossings for the characteristic of the frequency discriminator are obtained not only at the resonant frequency $f_o$ of the load but at opposite edges of the bandwidth of the load. These crossovers introduce an ambiguity that can cause the frequency lock system to lock the frequency of the source 18 to an off resonant condition of the load 12.

Figure 4:
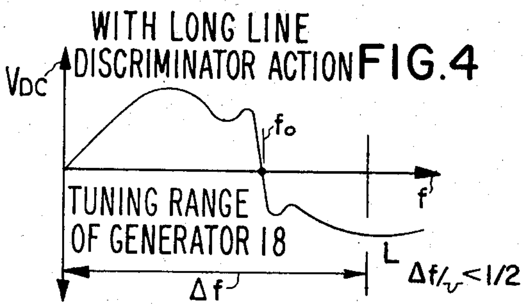
FIG. 4 is a plot similar to that of FIG. 3 depicting the output of the frequency discriminator utilizing the long line discriminator action and also depicting the relationship for the maximum differential length L between the incident power path and the reflected power path.

Accordingly, the long line section of transmission line 26 is provided in the path between the microwave generator 18 and the incident signal input port 1 of the hybrid coupler 24 such that the electrical transmission path length for the incident signal $V_i$ from the microwave source 18 to the input port 1 of the hybrid coupler is made to be equal to or longer than the electrical transmission path length from the source 18 through the circulator 19 to the resonant load 12 and back through the circulator, reflector and variable phase shifter 22 to the second input port of the hybrid coupler 24. In a typical example, the long line section of transmission line 26 comprises a temperature independent coaxial line such as model 61-375 obtainable from Prodlin of Hightstown, New Jersey. In a typical example, the long line section 26 is approximately 10 feet long corresponding to approximately 30 wavelengths at the operating frequency of the load 12. When the length of the transmission path for the incident signal $V_i$ is greater than the path length of the reflected signal $V_r$, the discriminator output characteristic of FIG. 2 is superimposed upon a much wider band discriminator characteristic of the excess line length L. As a result, the frequency discriminator characteristic is skewed in the opposite sense than that obtained when the reflected path length is longer than the incident path length. The excess path length L is chosen such that only one crossover of the output discriminator characteristic is obtained over the tuning range $\Delta f$ of the microwave generator 18. With a long line section of 30 wavelengths in the circuit of FIG. 1, the output characteristic of the frequency discriminator 24 is as shown in FIG. 4.

The amount by which the path length for the incident wave $V_i$ exceeds the path length for the reflected wave $V_r$ should not be too great or else the frequency discriminating action of the excess length L will produce an undesired crossover in the frequency discriminator output characteristics within the tuning range of the microwave generator 18. The maximum excess length L is defined by the following relation:

$$L \, \Delta f/v < 1/2 \quad (1)$$

where $\Delta f$ is the tuning range of the microwave generator 18, L is the excess electrical path length of the incident wave $V_i$ path over the reflected wave $V_r$ path at the input to the frequency discriminator, and $v$ is the velocity of wave propagation within the excess length of transmission line L. Thus, in a preferred embodiment, the excess path length L of transmission path for the incident signal $V_i$ is adjusted to produce only one crossover of the frequency discriminator characteristic within the tuning range of the generator 18 to remove any possible ambiguity in the frequency discriminator characteristic used for automatic tuning of the microwave source 18.

Although the hybrid coupler 24 has been described as a coaxial hybrid coupler, it may also be formed by a short slot waveguide hybrid coupler. In a typical example, the coaxial hybrid coupler is a model 3033 3 db quadrature coaxial hybrid coupler obtained from Narda of Planview, New York. Also the load medium for the resonant load 12 need not be a beam of charged particles. Other applications could employ resonant microwave applicator loads 12 using a material to be treated with microwave energy as the load medium.

What is claimed is:

1. In a microwave circuit of the type for locking the frequency of a microwave source to the resonant frequency of a resonant load;

load means resonant at a microwave frequency for producing electromagnetic interaction between the resonant fields of said resonant load and a load medium to be disposed in energy exchanging relation with said load means;

microwave source means for producing microwave energy of a microwave source frequency;

tuner means for tuning the source frequency of said microwave source means;

means for interconnecting said load means and said source means for coupling microwave energy from said source means to said load means for exciting microwave resonance of said resonant load means;

means for comparing the phase of the microwave energy supplied from said source means to said load means with the phase of microwave energy reflected from said resonant load back toward said source means to derive an error output the sense of which is determinative of the sense of departure, if any, of the microwave frequency of said source means from the microwave resonant frequency of said load means; and means for applying said error output to said tuner means for causing said tuner means to tune the frequency of said source means to produce a coincidence between the resonant frequency of said load and the frequency of the microwave energy supplied to said load from said source means.

2. The apparatus of claim 1 wherein said phase comparing means includes a microwave hybrid coupler means having; first and second input ports and first and second output ports, means for connecting said hybrid coupler means to receive a sample of the microwave energy applied to said load means at said first input port and to receive the load-reflected microwave energy at said second input port, means within said hybrid coupler for splitting the load-applied energy derived from said first input port into first and second incident signal components, means for shifting the phase of said second incident signal component by 90° relative to the phase of said first incident signal component, means for supplying said first incident signal component to said first output port and said second 90° phase shifted incident signal component to said second output port, means for splitting the reflected wave energy derived from said second input port into first and second reflected signal components, means for shifting the phase of said second reflected signal component by 90° relative to the phase of said first reflected signal component, means for supplying said 90° phase shifted second reflected signal component to said first output port and said first reflected signal component to said second output port.

3. The apparatus of claim 2 including first and second diode means connected to receive the output microwave energy derived from said first and second output ports, respectively, of said hybrid coupler means for rectifying said respective output signals to derive first and second rectified output signals, respectively.

4. The apparatus of claim 3 including means for comparing the sense and magnitude of said first and second rectified output signals to derive said error output.

5. The apparatus of claim 1 wherein said resonant load means comprises a resonant wave supportive structure, said structure being apertured for passage of a load medium therethrough in microwave energy exchanging relation with the microwave energy within said resonant wave supportive structure.

6. The apparatus of claim 5 wherein said resonant wave supportive structure comprises a coupled cavity microwave circuit, and including means for forming and projecting a stream of electrons as said load medium through said coupled cavity circuit for cumulative electromagnetic interaction with the electromagnetic microwave field of said microwave structure for accelerating electrons of said electron stream to an energy in excess of 0.5 million electron volts.

7. The apparatus of claim 1 wherein the electrical length of transmission path traversed by said phase compared incident microwave energy supplied directly from said microwave source means to said phase comparator means is greater than the electrical length of transmission path traversed by said phase compared reflected microwave energy in traveling from said microwave source means to said resonant load and thence to said phase comparator means, whereby the frequency discriminating characteristic of said error output is skewed to provide an unambiguous error output over a relative wide tunable range of said microwave source means.

8. The apparatus of claim 7 wherein the length of the transmission path for said phase compared incident wave energy exceeds the length of transmission path for the phase compared reflected wave energy by less than the length which will produce the first 180° of relative phase shift over the expected tuning range of said tunable microwave source means.

9. The apparatus of claim 7 wherein the length L by which the direct incident energy transmission path to said comparator means exceeds the reflected energy transmission path to said comparator means satisfies the relation:

$$L \Delta f/v < 1/2$$

where $\Delta f$ is the usable tuning range of said microwave source, and v is the velocity of wave energy propagation along said excess transmission path length L.

* * * * *